(12) United States Patent  
Kuo et al.

(10) Patent No.: US 11,195,737 B2  
(45) Date of Patent: Dec. 7, 2021

(54) APPARATUS FOR STORING AND TRANSPORTING SEMICONDUCTOR ELEMENTS, AND METHOD OF MAKING THE SAME

(71) Applicant: Taiwan Semiconductor Manufacturing Co., Ltd., Hsin-Chu (TW)

(72) Inventors: Ming-Sung Kuo, Hsin-Chu (TW); Jhih-Yuan Yang, Hsin-Chu (TW); Po-Wei Chen, Hsin-Chu (TW); Fang-yu Liu, Hsin-Chu (TW); Ping-Cheng Ko, Hsin-Chu (TW); Chung-Cheng Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 40 days.

(21) Appl. No.: 16/577,259

(22) Filed: Sep. 20, 2019

(65) Prior Publication Data  
US 2020/0105559 A1     Apr. 2, 2020

Related U.S. Application Data

(60) Provisional application No. 62/738,449, filed on Sep. 28, 2018.

(51) Int. Cl.  
*H01L 21/673* (2006.01)

(52) U.S. Cl.  
CPC .............................. *H01L 21/67376* (2013.01)

(58) Field of Classification Search  
CPC ....... B65D 85/48; H01L 21/67; H01L 21/673; H01L 21/6735; H01L 21/67359; H01L 21/67376

(Continued)

(56) References Cited

U.S. PATENT DOCUMENTS 2,732,581 A * 1/1956 Heck .................... E05D 5/10  
                                                220/840  
4,546,874 A   10/1985 Kirchhan  
(Continued)

FOREIGN PATENT DOCUMENTS

| CN | 1418166 A | 5/2003 |
| JP | H0640461 A | 2/1994 |
| TW | 201627213 A | 8/2016 |

OTHER PUBLICATIONS

Official Action dated Jan. 16, 2019, in corresponding Taiwan Patent Application No. 10820041630.

(Continued)

*Primary Examiner* — Rafael A Ortiz  
(74) *Attorney, Agent, or Firm* — Duane Morris LLP

(57) ABSTRACT

An apparatus for storing and transporting semiconductor elements includes a first portion and a second portion. The first portion includes a first front side wall, a first rear side wall, a top wall, and at least one pin holder integrally extending from the first rear side wall. The second portion includes a second front side wall, a second rear side wall, a bottom wall, and at least one pivotal pin structure integrally coupled with and extending from the second rear side wall. The at least one pivotal pin structure comprises a shaft, and a head connected with the shaft. The at least one pin holder defines a cavity sized and shaped to accept the head of the at least one pivotal pin structure. The first portion and the second portion are pivotally movable between an open configuration and a closed container configuration.

20 Claims, 18 Drawing Sheets

(58) Field of Classification Search
USPC ....... 206/710–712, 736, 223, 581, 385, 564, 206/823, 235, 459.5
See application file for complete search history.

(56) References Cited

U.S. PATENT DOCUMENTS

| | | | |
|---|---|---|---|
| 4,574,944 | A | 3/1986 | Gregory |
| 4,746,008 | A | 5/1988 | Heverly |
| 4,815,596 | A | 3/1989 | Reid |
| 5,024,329 | A | 6/1991 | Grohrock |
| 5,048,715 | A | 9/1991 | Wolff |
| 6,131,760 | A | 10/2000 | Huang |
| 6,354,461 | B1 | 3/2002 | Tenney |
| 7,810,644 | B2 * | 10/2010 | Fraillon ............... A45D 33/006 206/581 |
| 7,963,131 | B2 | 6/2011 | Zhang |
| 8,893,731 | B2 * | 11/2014 | Pires .................... A45D 33/006 132/294 |
| 2003/0062275 | A1 | 4/2003 | Rochelo |
| 2006/0011504 | A1 * | 1/2006 | Gosebruch ............... G09F 3/00 206/459.5 |
| 2007/0029226 | A1 * | 2/2007 | Yuhara ................. A45D 33/006 206/581 |
| 2009/0255846 | A1 * | 10/2009 | Pires ...................... A45D 40/24 206/581 |
| 2012/0305417 | A1 * | 12/2012 | Yoshida ............... A45D 33/008 206/235 |

OTHER PUBLICATIONS

Notice of Co-Pending U.S. Appl. No. 15/713,772, filed Sep. 25, 2019.

\* cited by examiner

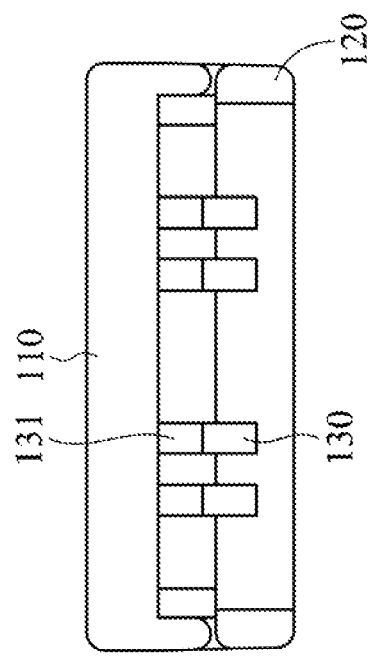
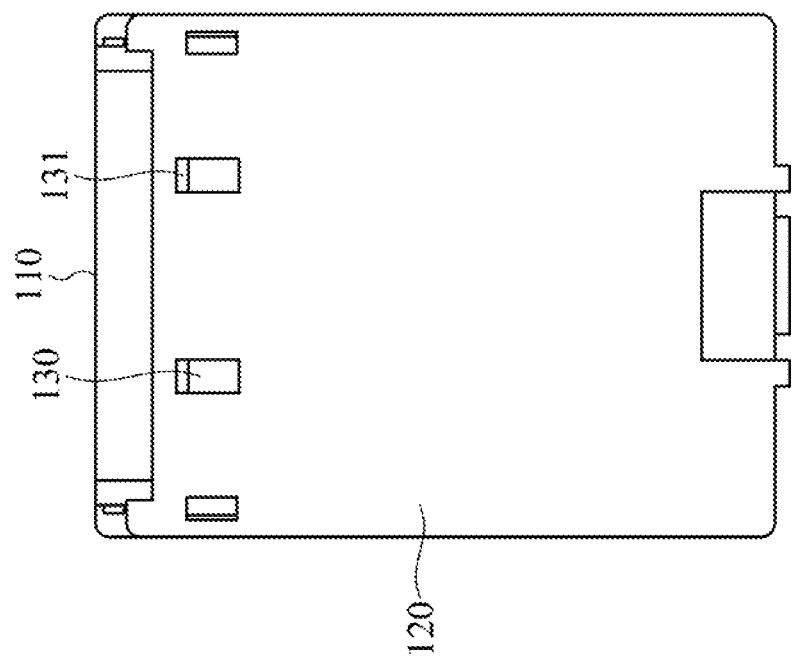
FIG. 8D
FIG. 8C

_US 11,195,737 B2_

APPARATUS FOR STORING AND TRANSPORTING SEMICONDUCTOR ELEMENTS, AND METHOD OF MAKING THE SAME

PRIORITY CLAIM AND CROSS-REFERENCE

This application claims the benefit of U.S. Provisional Application No. 62/738,449, filed Sep. 28, 2018, which application is expressly incorporated by reference herein in its entirety.

BACKGROUND

In the fabrication processes for making semiconductor devices, semiconductor substrates such as wafers are processed under clean room conditions. Off-site analysis of samples of the semiconductor substrates or elements thereof before or after a certain manufacturing step are needed for different purposes, for example, for quality check. Such samples are generally packed in a container for storing, transporting and/or shipping. Containers whose interior offers a clean room climate are therefore necessary for storing the semiconductor wafers and for transporting the semiconductor wafers to the various processing locations. The containers should be optimally tight, and should not release any contaminating substances, for example, particles or gases. As the wafer size gets larger while the resulting devices are scaled to smaller sizes, new materials and containers are being considered for protecting sensitive semiconductor elements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

FIG. 8C is a bottom plan view of the exemplary apparatus of FIG. 1.

FIG. 8D is a rear plan view of the exemplary apparatus of FIG. 1.

DETAILED DESCRIPTION

Figure 1:
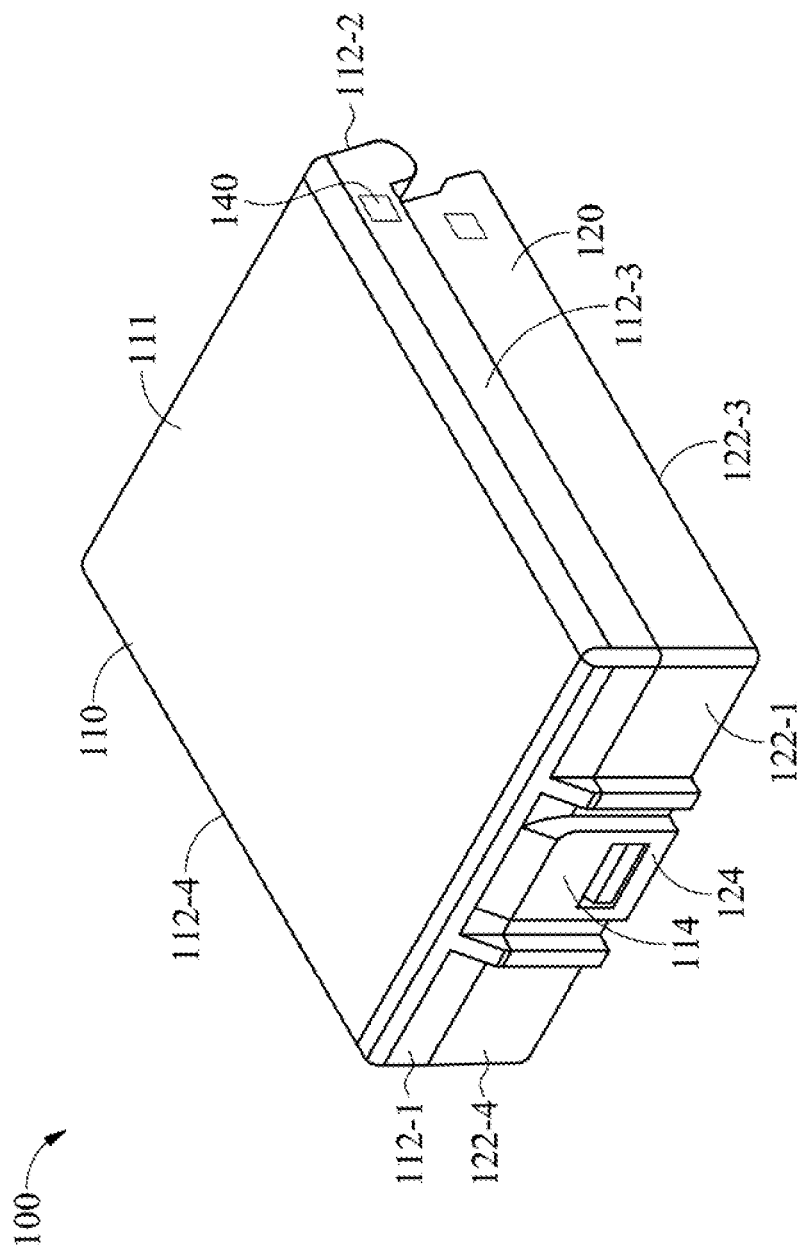
FIG. 1 is a top perspective view illustrating an exemplary apparatus in a closed container configuration in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure the singular forms "a," "an," and "the" include the plural reference, and reference to a particular numerical value includes at least that particular value, unless the context clearly indicates otherwise. Thus, for example, a reference to "a side wall" is a reference to one or more of such structures and equivalents thereof known to those skilled in the art, and so forth. When values are expressed as approximations, by use of the antecedent "about," it will be understood that the particular value forms another embodiment. As used herein, "about X" (where X is a numerical value) preferably refers to ±10% of the recited value, inclusive. For example, the phrase "about 8" preferably refers to a value of 7.2 to 8.8, inclusive; as another example, the phrase "about 8%" preferably (but not always) refers to a value of 7.2% to 8.8%, inclusive. Where present, all ranges are inclusive and combinable. For example, when a range of "1 to 5" is recited, the recited range should be construed as including ranges "1 to 4", "1 to 3", "1-2", "1-2 & 4-5", "1-3 & 5", "2-5", and the like. As discussed herein, the phrases "substantially the same" or "slightly larger" may refer to a dimension having variations within ±10% of the base dimension. It is intended that any component, element, attribute, or step that is positively recited herein may be explicitly excluded in the claims, whether such components, elements, attributes, or steps are listed as alternatives or whether they are recited in isolation.

The present disclosure provides an apparatus, and a method of making the same. The apparatus is used for storing and transporting semiconductor elements. References to "apparatus" made below will be understood to encompass a container, a delivery unit, an assembly, a system thereof, and the like. References to "semiconductor elements" made below will be understood to encompass any semiconductor based samples or products including but not limited to wafers, portions of wafers, and semiconductor devices.

In all the figures, like items are indicated by like reference numerals, and for brevity, descriptions of the structure, provided above with reference to the preceding figures, are not repeated. The method described in FIG. 12 is described with reference to the exemplary structures described in FIGS. 1-11.

Referring to FIGS. 1, 2, 3A to 3D, and 4, an exemplary apparatus 100 is illustrated. Exemplary apparatus 100 includes two body portions, including a first portion (or a first body portion) 110 and a second portion (or a second body portion) 120. The first portion 110 includes a top wall 111, a first front side wall 112-1, a first rear side wall 112-2, and two additional side walls 112-3 and 112-4. The top wall 111 is integrally coupled with the first front side wall 112-1, the first rear side wall 112-2, and additional side walls 112-3 and 112-4.

The first portion 110 also comprises at least one pin holder 116 integrally extending from the first rear side wall 112-2. In some embodiments, the first portion 110 is the top portion or the cover of the exemplary apparatus 100. In some embodiments, first portion 110 is a unitary molded piece.

The second portion 120 includes a bottom wall 121, a second front side wall 122-1, a second rear side wall 122-2, and two additional side wall 122-3 and 122-4 integrally connected with the second front side wall 122-1 and the second rear side wall 122-2. The bottom wall 121 is integrally coupled with the second front side wall 122-1, the second rear side wall 122-2, and the other two additional side wall 122-3 and 122-4 (FIGS. 1 and 3D). In some embodiments, the second portion 120 is the bottom portion of the exemplary apparatus 100. In some embodiments, the second portion 120 is a unitary molded piece.

The second portion 120 also comprises at least one pivotal pin structure 126, which is integrally coupled with and extends from the second rear side wall 122-2

Figure 3A:
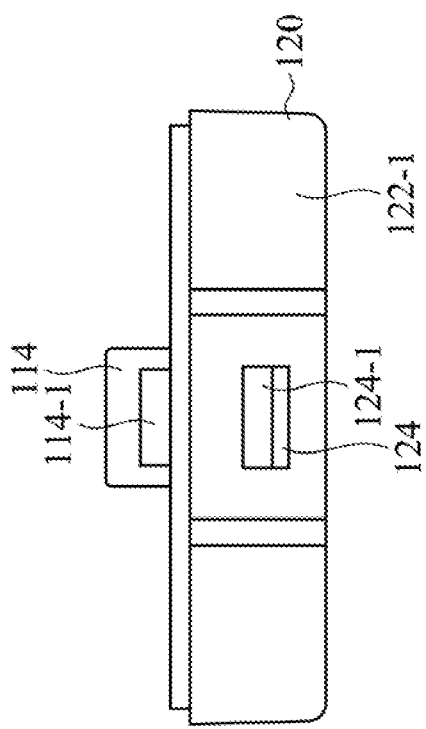
FIG. 3A illustrates a front plan view of the exemplary apparatus of FIG. 1 in the closed container configuration.
Figure 3B:
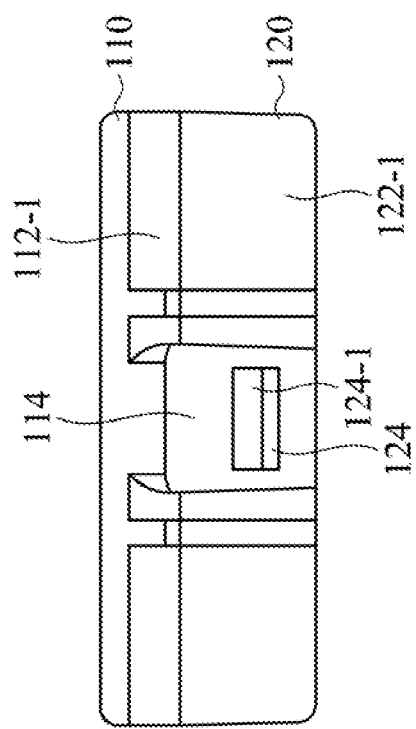
FIG. 3B illustrates a front plan view of the exemplary apparatus of FIG. 1 in the closed container configuration, in which the latch structure is opened.
Figure 3C:
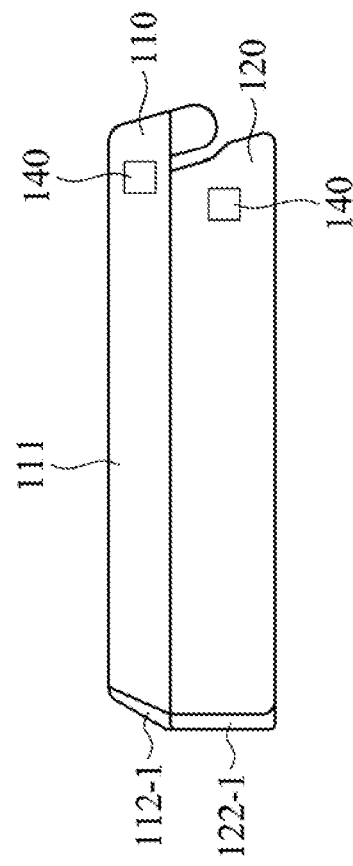
FIG. 3C illustrates a side plan view of the exemplary apparatus of FIG. 1 in the closed container configuration.
Figure 3D:
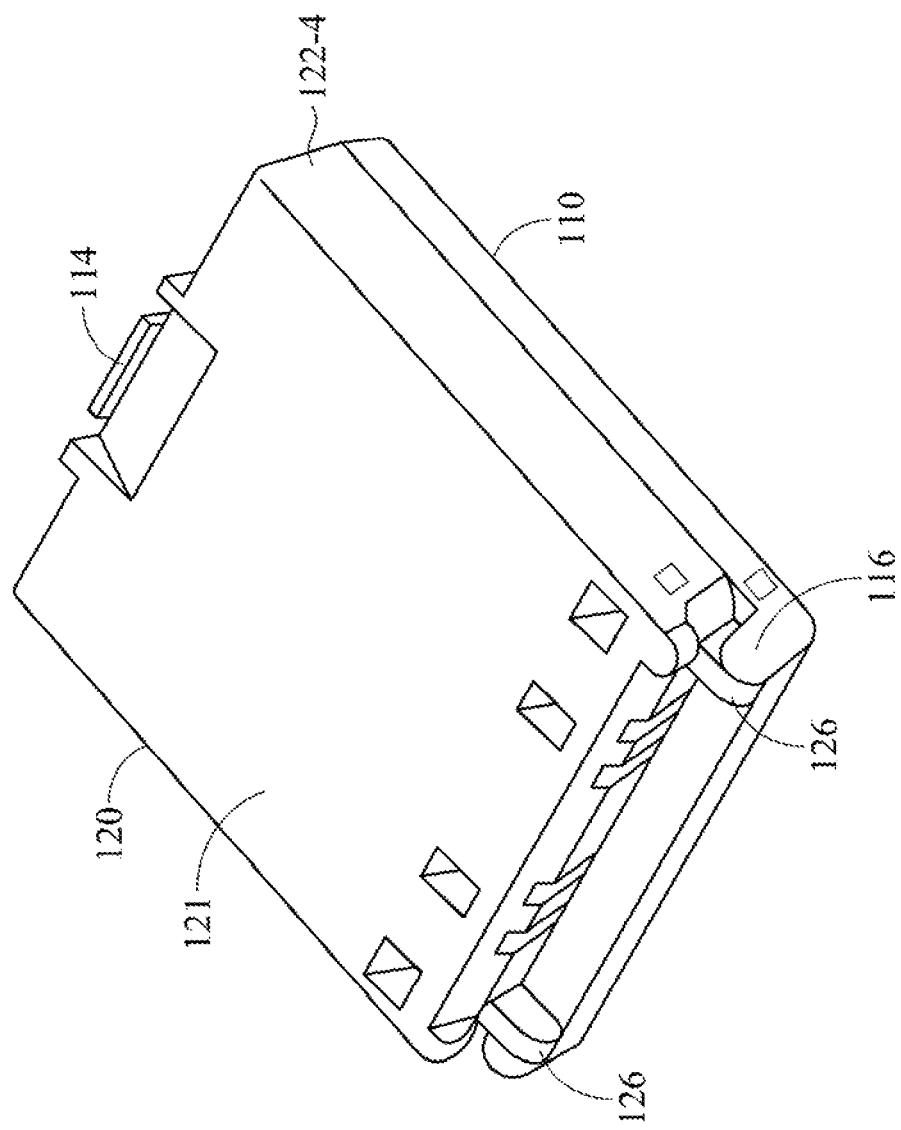
FIG. 3D is a bottom perspective view of the exemplary apparatus of FIG. 1.
Figure 4:
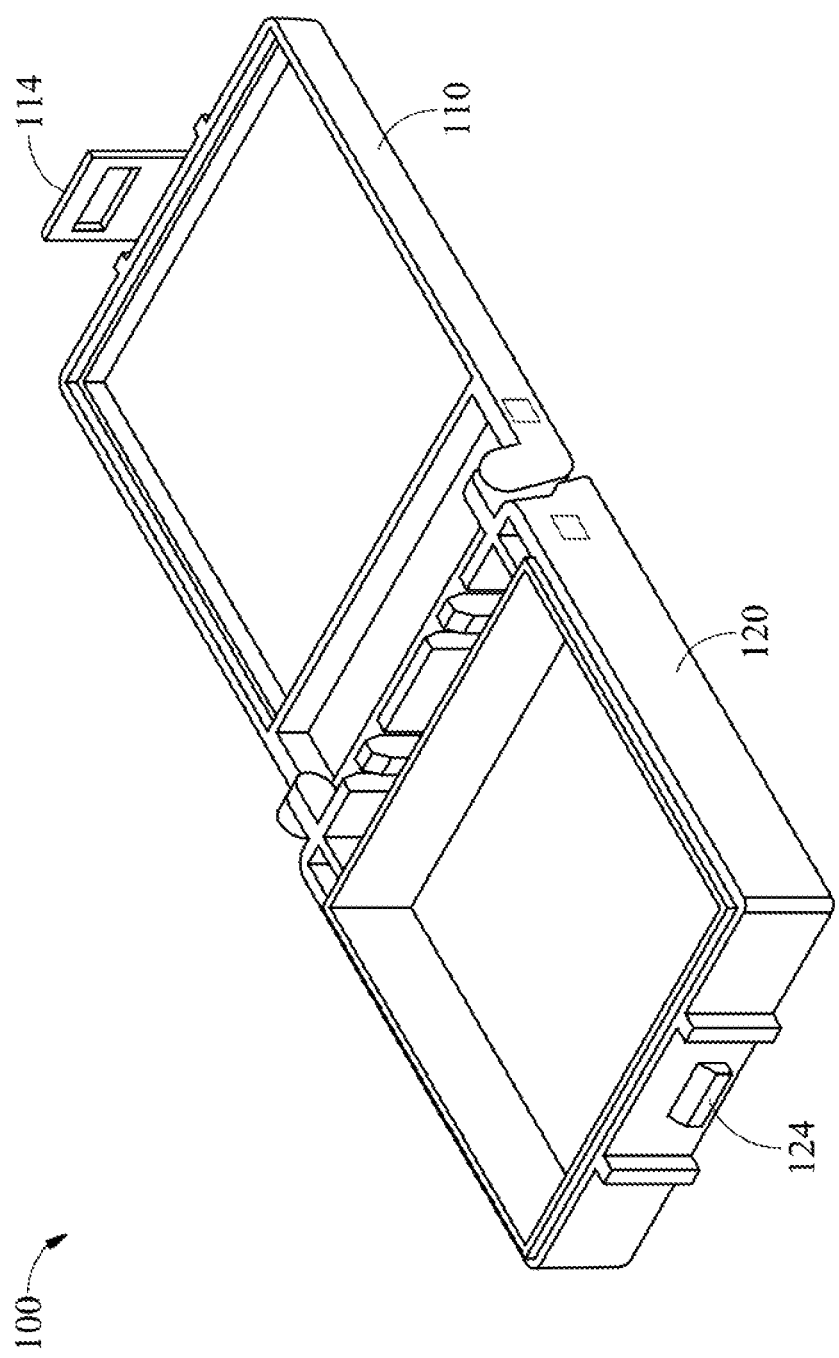
FIG. 4 illustrates a perspective view of the exemplary apparatus of FIG. 1 in an open configuration.

Referring to FIGS. 1 and 3A-3C, in some embodiments, the first portion 110 further comprises a latch 114 defining notch 114-1 (or a hole) and integrally connected with the first front side wall 112-1. The second portion 120 further comprises a catch structure 124 having a projection 124-1 on the second front wall 122-1. The projection 124-1 is configured to be disposed into the notch 114-1 to releasably secure the latch 114 in the closed container configuration (FIG. 3A). In some embodiments, the latch 114 is configured to be moved toward the surface of the second front wall 122-1 so that the projection 124-1 is positioned into the notch 114-1 of the latch 114, securing the apparatus 100 in the closed container configuration. In some embodiments, the catch structure 124 include an open beveled trapezoid shape, in which the projection 124-1 has a slanted top surface and a flat bottom surface. The slanted top surface is downward, and the flat bottom surface faces down.

Each wall of the first portion 110 and the second portion 120 may be in a square or rectangular shape as illustrated in the drawings of the present disclosure. However, these drawings are for illustration only. Each wall of the first portion 110 and the second portion 120 may be in any other suitable shape. Two additional side walls 112-3, 112-4, 121-3, and 121-4 may be optional in some embodiments. For example, the front walls 112-1 and 121-2, and the rear walls 112-2 and 112-4 may be curved and directly connected together in some embodiments. When each wall of the first portion 110 and the second portion 120 is in a square, rectangular or curved shape, each corner of the exemplary apparatus 100 may have a smooth curvature in some embodiments.

Each wall of the first portion 110 and the second portion 120 may be in any size or dimension. For example, as illustrated the drawings such as FIGS. 1 and 4, the first front wall 112-1 of the first portion 110 may be a narrow strip in some embodiments.

Figure 5B:
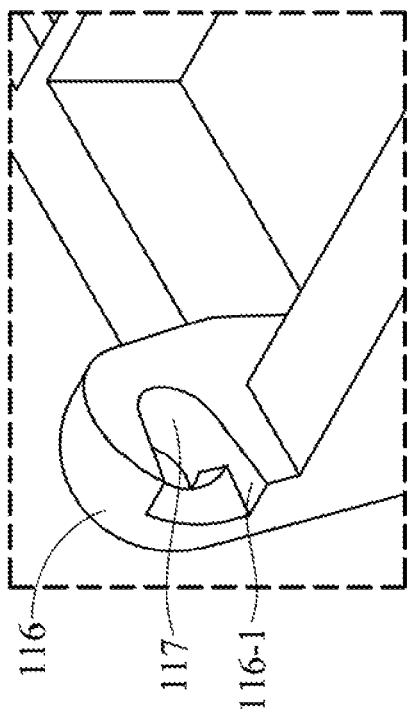
FIG. 5B is a partial perspective view of the exemplary first portion of FIG. 5A in accordance with some embodiments.
Figure 5C:
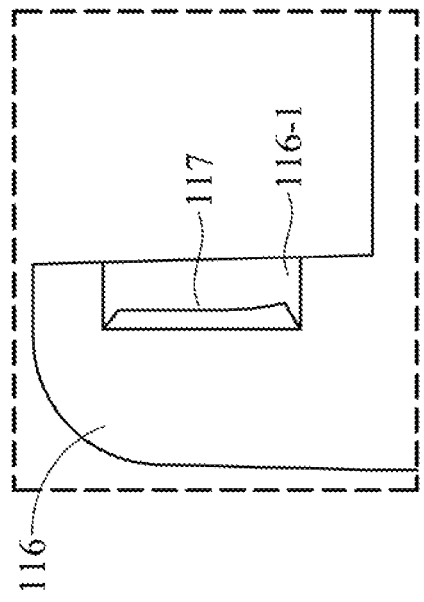
FIG. 5C is a partial plan view of the exemplary first portion of FIG. 5A in accordance with some embodiments.
Figure 5A:
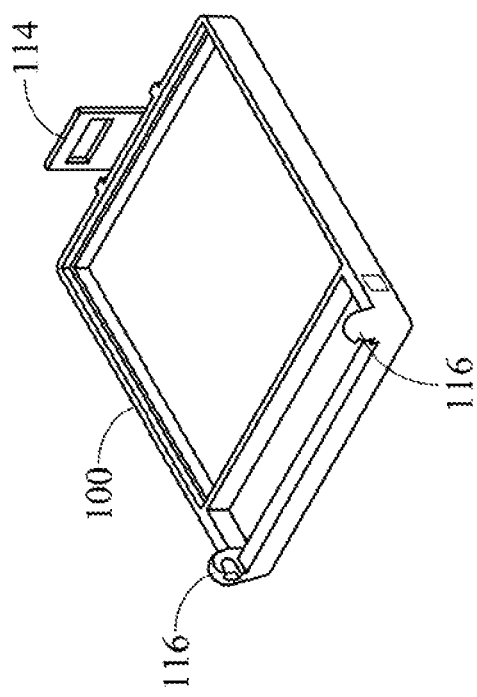
FIG. 5A is a perspective view illustrating the exemplary first portion of the exemplary apparatus of FIG. 1A in accordance with some embodiments.

Referring to FIGS. 5A-5C, in some embodiments, the at least one pin holder 116 in the first portion 110 defines a cavity 117. In some embodiments, the at least one pin holder 116 includes two pin holders 116 oppositely disposed and extending from the corners where the first rear side wall 112-2 meets the additional sides walls 112-3, 112-4. The at least one pin holder 116 may extrapolate from the first rear side wall 112-2 at two corners in some embodiments.

Figure 6A:
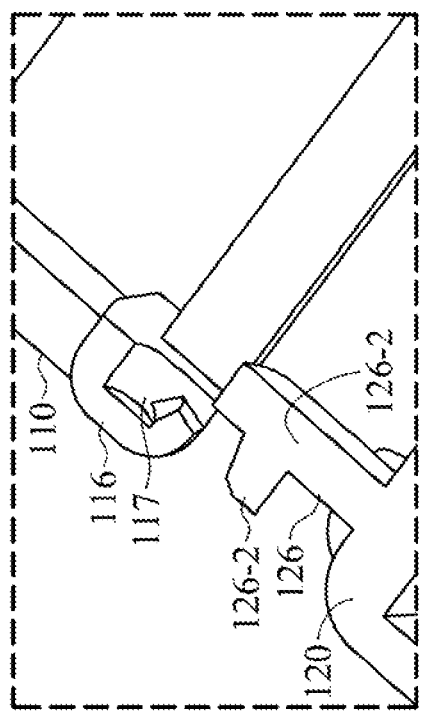
FIGS. 6A-6B are partial sectional and perspective views illustrating one exemplary pin holder in the first portion and one exemplary pivotal pin structure before and after they are coupled together, respectively, in accordance with some embodiments.
Figure 6B:
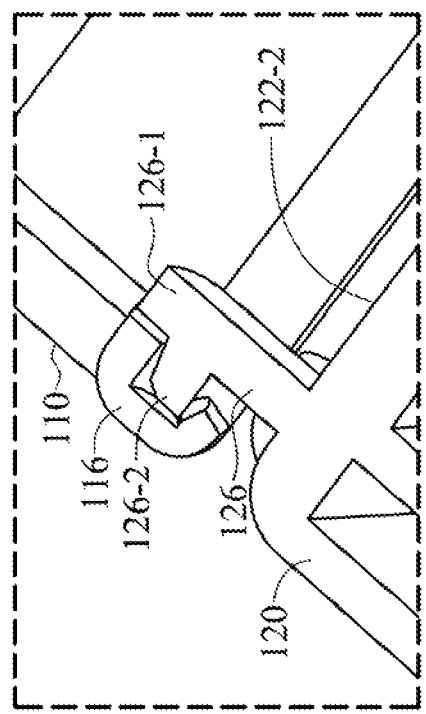
Figure 6C:
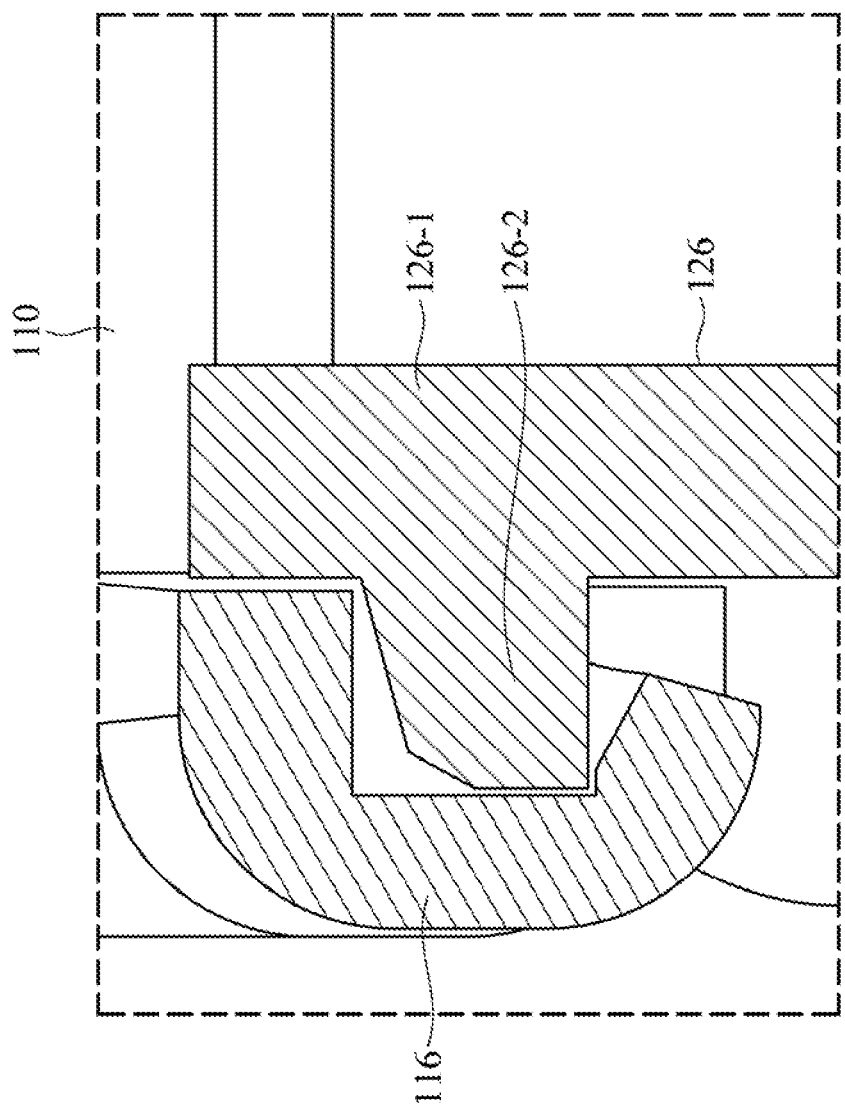
FIG. 6C is a sectional view illustrating the exemplary pin holder and the exemplary pivotal pin structure coupled together in accordance with some embodiments.

Referring to FIG. 6A-6C, in some embodiments, the at least one pivotal pin structure 126 in the second portion 120 includes a shaft 126-1 connected with the second rear side wall 122-2, and a head 126-2 extending from the shaft 126-1.

The cavity 117 is sized and shaped to accept the head 126-2 of the at least one pivotal pin structure 126 at alignment. As shown in FIG. 6B, the head 126-2 of the at least one pivotal pin structure 126 is disposed inside the cavity 117.

Figure 2:
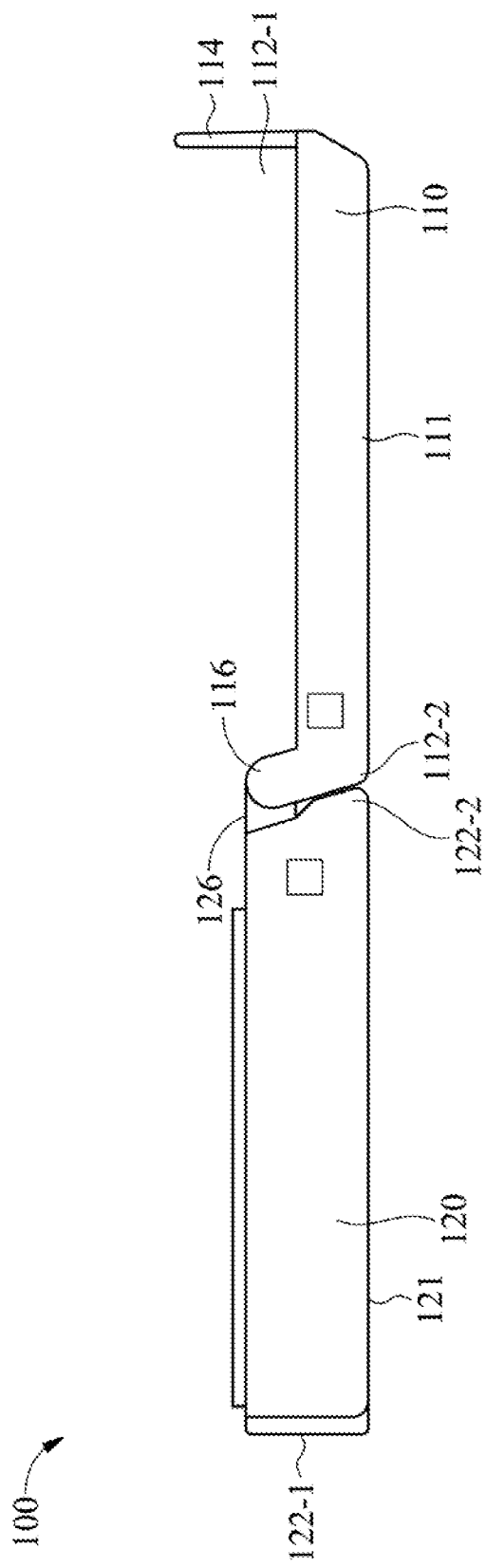
FIG. 2 illustrates a side plan view of the exemplary apparatus of FIG. 1 in an open configuration.
Figure 7:
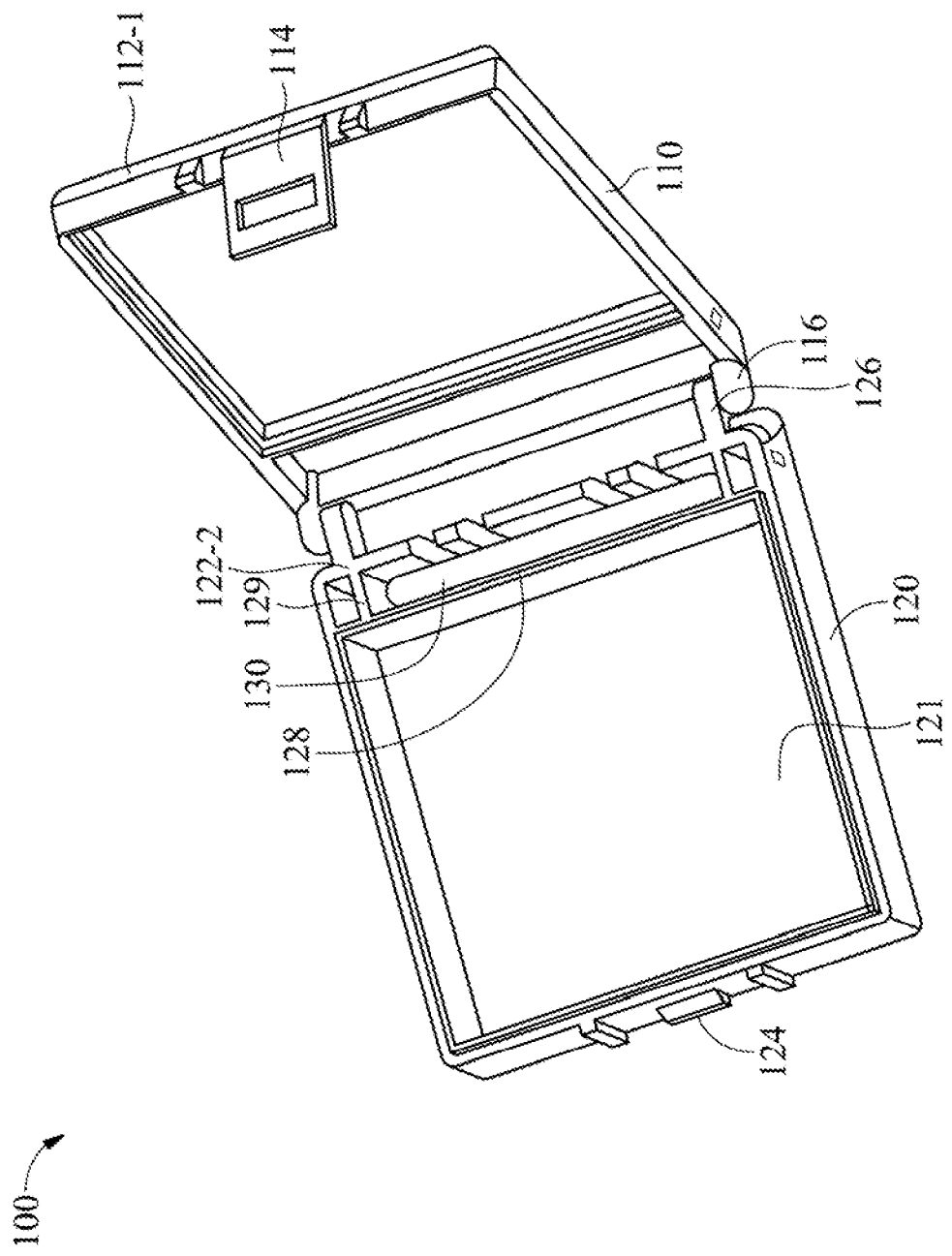
FIG. 7 illustrates a perspective view of the exemplary apparatus of FIG. 1 in an open configuration.
Figure 9:
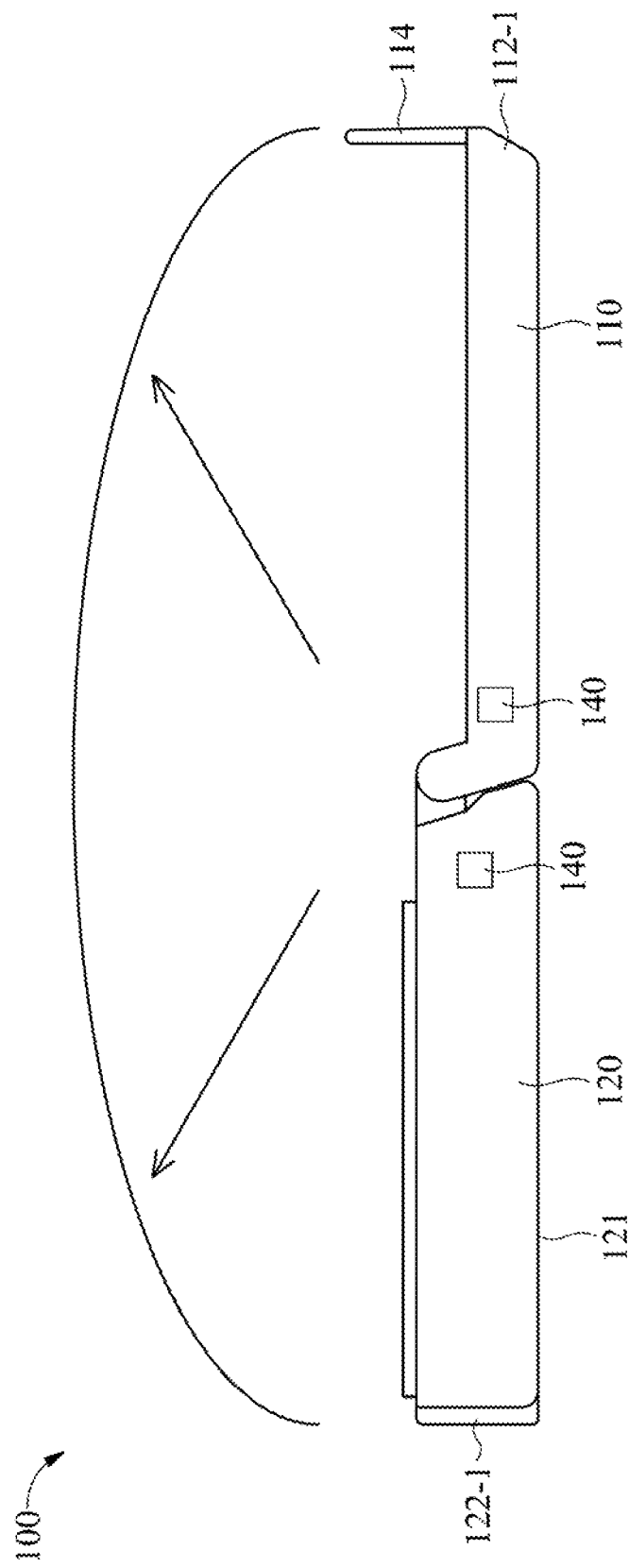
FIG. 9 is a side plan view of the exemplary apparatus of FIG. 1 in an open configuration illustrating that the first portion and the second portion are configured to move by angle between 0 degree to 180 degree relative to each other in accordance with some embodiments.

The first portion 110 and the second portion 120 are sized and shaped to be pivotally movable between a closed container configuration (FIG. 1) an open configuration (FIGS. 2, 7, and 9).

Referring to FIGS. 5A-C and 6A-6C, in some embodiments, the at least one pin holder 116 comprises a groove introduction surface or plane 116-1 (FIGS. 5B-5C) to facilitate insertion of the head 126-2 of the at least one pivotal pin structure 126 into the cavity 117. The cavity 117 in the at least one pin holder 116 may have a non-circular cross-sectional shape matching with and having substantially the same size as a non-circular cross-sectional shape of the head 126-2 of the at least one pivotal pin structure 126. In some embodiments, the head 126-2 and the shaft 126-1 in the at least one pivotal pin structure 126 are normal to each other, and form an axe-shaped structure.

Referring to FIGS. 2 and 9, in some embodiments, the at least one pin holder 116 is configured to be rotatable about the head 126-2 of the at least one pivotal pin structure 126 so that the first portion 110 is pivotally movable by 180 degrees relative to the second portion 120 from the closed container configuration to the open configuration. In the open configuration, the top wall 111 of the first portion 110 is coplanar with the bottom wall 121 of the second portion 120, and the first and second rear side walls 112-2, 122-2 face each other. In some embodiments, the first portion 110 and the second portion 120 cannot be separated unless the apparatus 100 is in a flat open position, in which the first portion 110 and the second portion 120 are oriented at 180 degrees to one another.

Referring to FIG. 7, in some embodiments, the at least one pin holder 116 includes two pivotal pin holders. The at least one pivotal pin structure 126 in the second portion 120 includes two pivotal pin structures. Each respective pivotal pin structure 126 is engaged with a respective pin holder 116. The two pivotal pin structures 126 have a same dimension and are aligned opposite to one another. The two pin holders 116 face toward each other. The pivotal pin structures 126 are hidden inside the pin holders 116.

Referring to FIGS. 7, and 8A-8D, in some embodiments, the exemplary apparatus 100 further includes a storage medium 130 for holding a wireless communication device, for example, a radio-frequency identification (RFID) device, which might be inside the apparatus 100 in the closed container configuration.

The storage medium for wireless communication 130 may include aerial signal processor for storing information such as identification of samples inside the exemplar apparatus 100, quantity, weight and history record. RFID uses electromagnetic fields to automatically identify and track tags or devices attached to the exemplary apparatus 100. Such RFID devices contain electronically stored information. Passive tags or devices collect energy from a nearby RFID reader's interrogating radio waves. Active tags have a local power source such as a battery and may operate at hundreds of meters from the RFID reader. A receiver such as a computer may be used to record and track the information transmitted from the storage medium 130 for holding a wireless communication device. In some embodiments, a reading device may be used to read out the information in storage medium 130 for wireless communication. For example, a reading device such as GDE equipment is available from Gudeng Equipment Co., Ltd in Taiwan.

The RFID device may be capacitive or inductive. In some embodiments, the RFID device is inductive.

In some embodiments, the second portion 120 further includes a third wall 128 between the second rear wall 122-2 and the second front wall 122-1. The third wall is closer to the second rear wall 122-2 than the second front wall 122-1. The second rear wall 122-2 and the third wall 128, together with side walls, define a compartment 129 for housing the storage medium 130 for holding a wireless communication device. The compartment 129 has a size the same or slightly larger than that of the storage medium 130 for a wireless communication device, which is disposed and fixed in the compartment 129 inside the second portion 120, and between the third and the second rear side wall 128 and 122-2.

The storage medium 130 for wireless communication may have an elongated shape such as a cylindrical or rod-like shape. The compartment 129 may have a size smaller than the diameter of the storage medium 130 for wireless communication. A force is needed to push the storage medium 130 for wireless communication into the compartment 129 and the storage medium 130 for wireless communication is secured inside the apparatus 100.

Figure 8B:
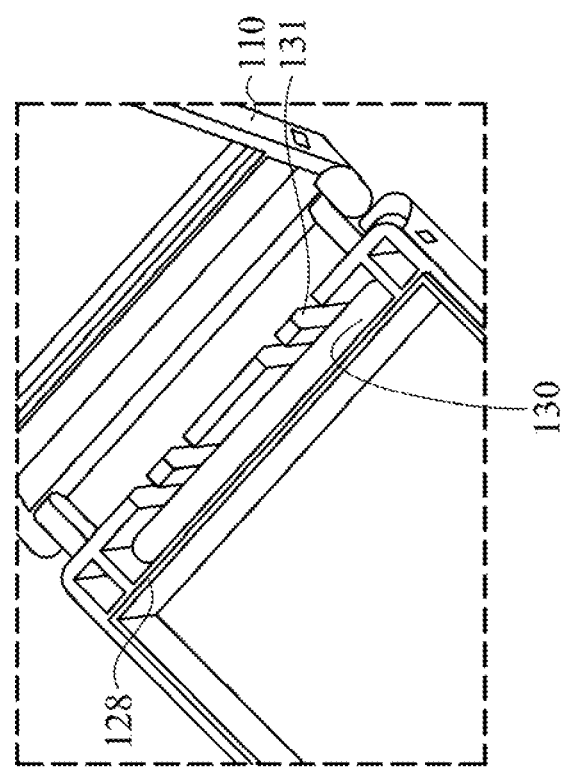
FIG. 8B is a partial perspective view of the exemplary apparatus as shown in FIG. 7.
Figure 8A:
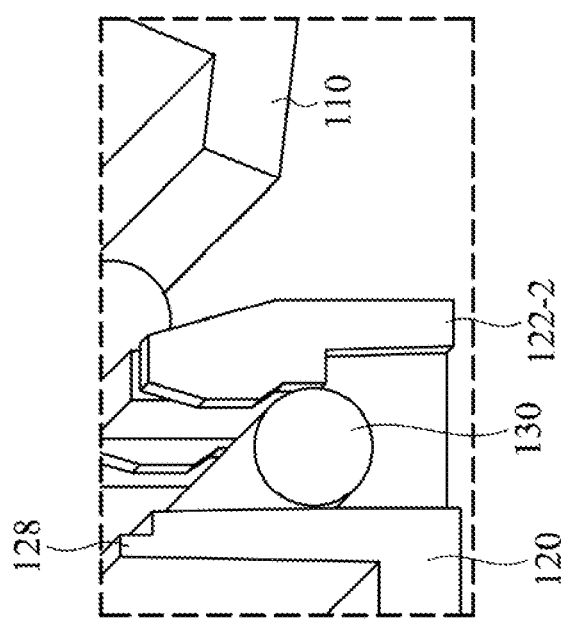
FIG. 8A is a partial sectional view and a partial perspective view of the exemplary apparatus as shown in FIG. 7.

Referring to FIGS. 8B-8D, in some embodiments, the second rear side wall 121-2 or the bottom wall 121 or both may have one or more small openings 131 so that at least a portion of the storage medium 130 for wireless communication is exposed and can be seen from outside the apparatus 100 when the apparatus 100 is in the closed container configuration. The small openings 131 may be connected with the interior of the apparatus for good drainage of possible condensation or liquid inside, for example, after washing.

Figure 10:
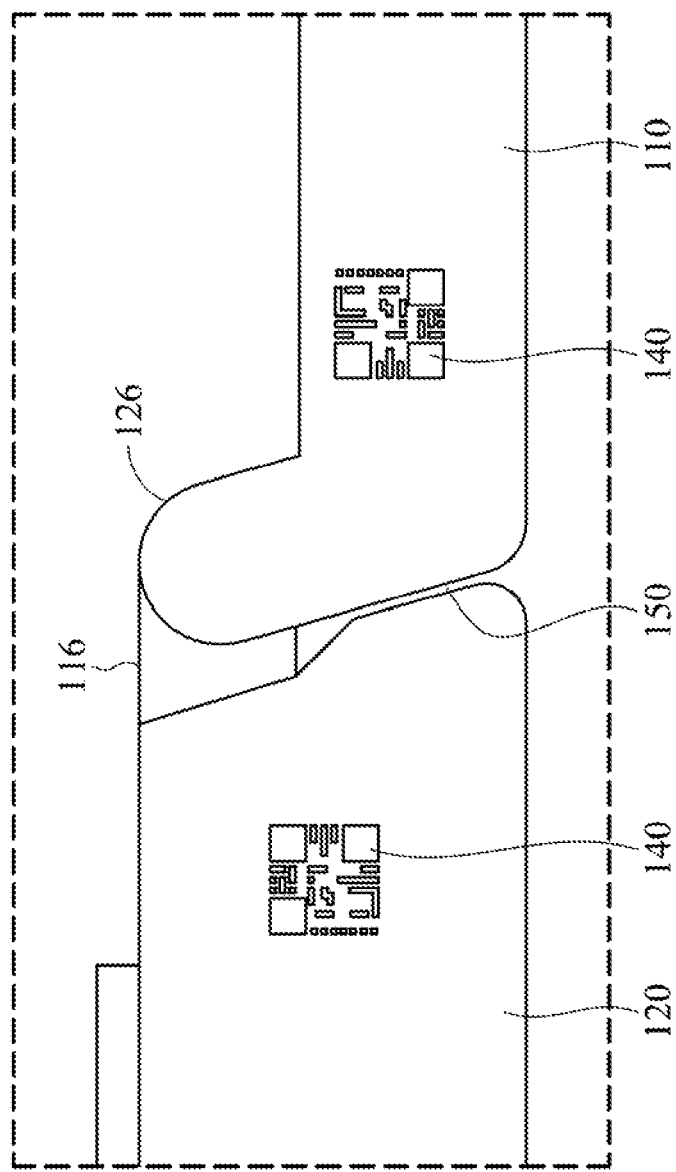
FIG. 10 is a partial side plan view of the exemplary apparatus as shown in FIG. 9.

Referring to FIGS. 9 and 10, in some embodiments, the exemplary apparatus 100 further includes at least one quick response (QR) code 140, which is engraved on an exterior surface of at least one of the first portion 110 and the second portion 120. The QR code 140 include two-dimensional bar codes, which can be scanned using a scanning device or a smart phone. The QR code 140 can be engraved on the first portion 110 and/or the second portion 120 using laser.

Figure 11:
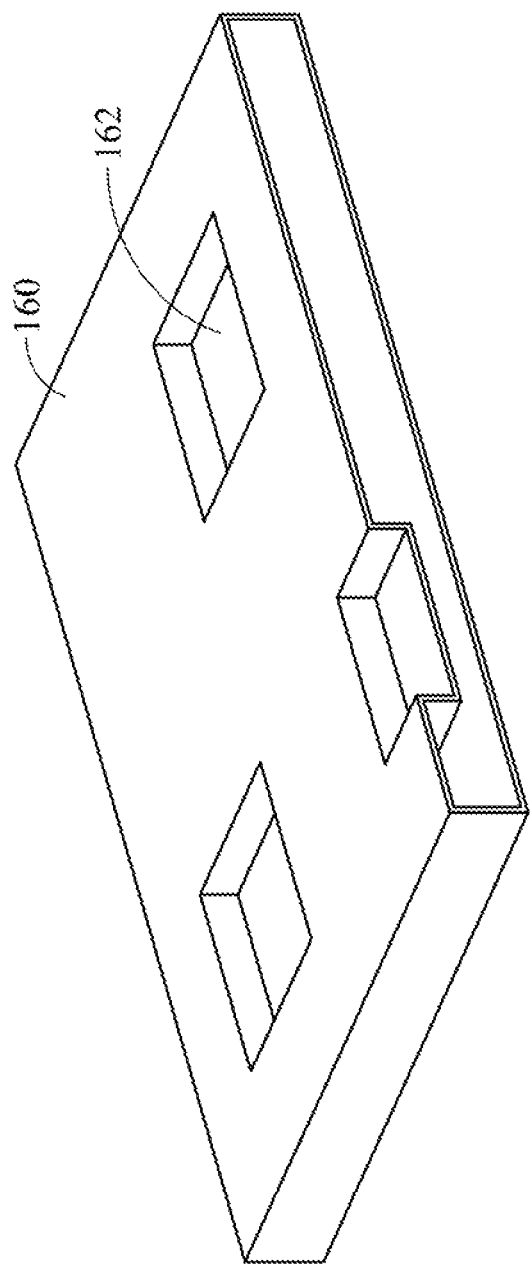
FIG. 11 is a partial and perspective view illustrating a gel pad disposed inside the apparatus walls in accordance with some embodiments.
Figure 12:
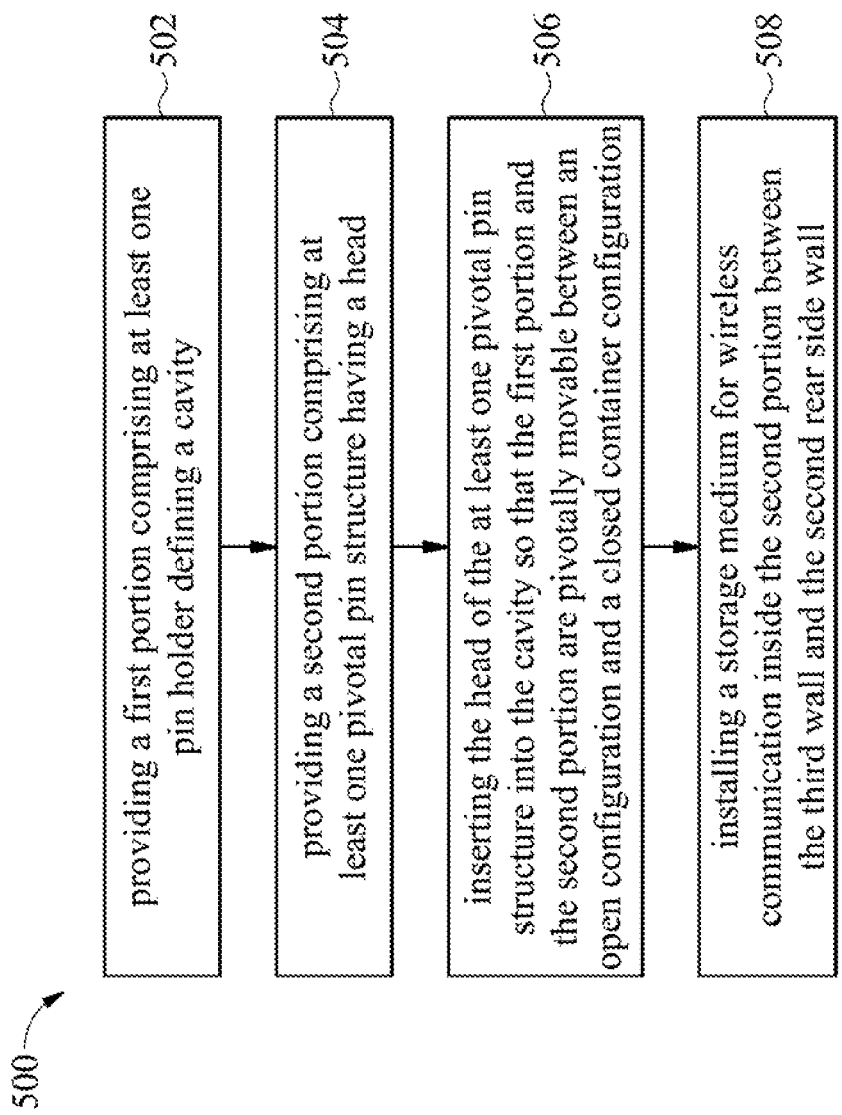
FIG. 12 is a flow chart illustrating an exemplary method for forming an apparatus in accordance with some embodiments.

Referring to FIG. 11, in some embodiments, the exemplary apparatus 100 further includes one or more tray 160 comprising a gel material disposed above the bottom wall 121 configured to store semiconductor elements. The tray 160 may have grooves or trenches 162 for storing semiconductor elements. The tray 160 can be made of a plastic or a rubber material such as silicone, and may contains one, two, three or more grooves or trenches 162.

In accordance with some embodiments, an apparatus 100 for transporting semiconductor elements, includes a first portion 110 and a second portion 120. The first portion 110 includes a first front side wall 112-1, a first rear side wall 112-2, a top wall 111, and two pin holders 116 integrally extending from the first rear side wall 112-2. The second portion 120 comprises a second front side wall 122-1, a second rear side wall 122-2, a bottom wall 121, and two pivotal pin structures 126 integrally coupled with and extending from the second rear side wall.

In some embodiments, each of the two pivotal pin structures 126 includes a shaft 126-1 connected with the second rear side wall 122-2, and a respective head 126-2 connected with the shaft 126-1. The two pivotal pin structures 126 are aligned in opposite directions. Each of the two pin holders defines a respective cavity, which is sized and shaped to accept the respective head at alignment. The respective head is disposed inside the respective cavity. The first portion 110 and the second portion 120 are sized and shaped to be pivotally movable between an open configuration and a closed container configuration. In some embodiments, the apparatus further includes a storage medium for wireless communication 130 disposed between a third wall 128 and the second rear side wall 121-2.

Each of the first portion 110 and the second portion 120, including the component thereof, may be one unitary molded piece in some embodiments. The first portion 110 and the second portion 120 can be molded from the same or different material, which may be plastic, plastoelastomer, elastomer, composite, or any other polymer containing material. The material may comprise a suitable polymer, including but not limited to, polycarbonate, polyester (e.g., PET), polyolefin, or any combination thereof. The material may comprise a conductive filler such as metals or a conductive polymer to provide anti-static properties. The material has a smooth surface, and also has high strength, toughness, and impact resistance. The resulting apparatus does not break upon a mechanical shock. Such a material may be translucent, transparent or opaque. In some embodiments, a UV resistant translucent material is used. The material is also resistant to chemicals such as acids, bases, and organic solvents, and can be washed after use. The material also withstands a temperature up to a limit, for example, 100° C., 120° C., or 150° C. In some embodiments, the material has a continuous temperature rating up to 120° C.

In some embodiments, the first portion 110 and the second portion 120 comprises a polymer composition comprising polycarbonate. The polymer composition may have a surface impedance in a range of from $10^{11}$ ohms to $10^{16}$ ohms. The polymer composition may be polycarbonate, or a polycarbonate blend, which has good optical transparency, heat resistance, impact resistance, and flame retardancy, as well as high refraction index and mechanical properties. For example, in some embodiments, even without additives, the polymer composition is polycarbonate based, and passes UL 94 V-0 flame test. The polymer composition may also have low temperature rating as low as −40° C., and are also resistant to chemicals. The polymer composition has good purity and does not release particles to contaminate the semiconductor parts.

In some embodiments, polycarbonate is poly(4,4'-isopropylidendiphenyl carbonate). Other variations can be also used. In some embodiments, the polymer composition comprises polycarbonate and an additive such as an antistatic agent. In such a composition, polycarbonate is present in a range of from about 55% to about 99% by weight of the composition, and the additive is present in a range of from about 1% to about 35% by weight of the composition. For example, the content of polycarbonate may be 55%, 60%, 65%, 70%, 75%, 80%, 85%, 90%, 99%, or any other percentage. The content of the additive may be 45%, 40%, 35%, 30%, 25%, 20%, 15%, 10%, 1%, or any other percentage. The additive may be electrically conductive particles in spherical shape in some embodiments. The polymer composition can compounded in a single- or twin-screw extruder.

In some embodiments, the additive may be one or more antistatic agent. The resulting apparatus has good antistatic performance. The polymer composition provides a very smooth surface with uniform appearance. Under a scanning electronic microscopy, no impurity or phase separation can be observed. The blend can be a molecular level blend. Such an appearance can be described as "atomization." Some existing apparatus may become hazy upon application of high voltage. The apparatus 100 is clear even when high voltage is applied. The apparatus 100 is used for storing and transporting semiconductor elements, without any contamination from outside or any damage from chemicals, mechanical shock, heat or UV.

The exemplary apparatus 100 may be in any suitable size, for example, 16 mm×42 mm×42 mm, 19 mm×64 mm×64 mm, 20 mm×110 mm×90 mm, or 20 mm×165 mm×165 mm (height×length×width).

Referring to FIG. 12, an exemplary method 500 for forming an exemplary apparatus 100 is illustrated.

At step 502, a first portion 110 as described herein is provided. The first portion 110 comprises a first front side wall 112-1, a first rear side wall 112-2, a top wall 111, and at least one pin holder 116. The top wall 111 is integrally coupled with the first front side wall 112-1 and the first rear side wall 112-2. The at least one pin holder 116 is integrally extending from the first rear side wall 112-2. The at least one pin holder 116 defines a cavity 117.

At step 504, a second portion 120 as described herein is provided. The second portion 120 comprises a second front side wall 122-1, a second rear side wall 122-2, additional side walls 112-3 and 112-4, a bottom wall 121 integrally coupled with side walls, and at least one pivotal pin structure 126. The at least one pivotal pin structure 126 is integrally coupled with and extending from the second rear side wall 122-2. The at least one pivotal pin structure 126 comprises a shaft 126-1 connected with the second rear side wall 122-2, and a head 126-2 connected with the shaft 126-1.

Figure 13B:
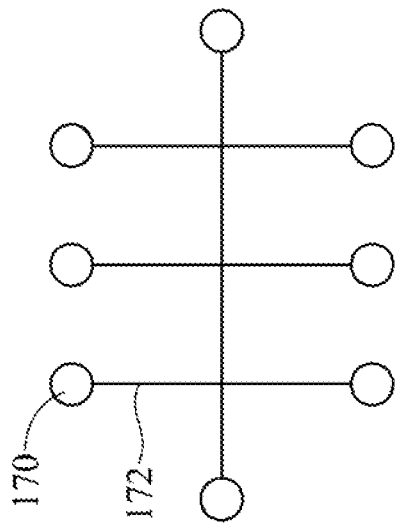
FIGS. 13A-13C illustrate exemplary runner system constructions used in molding the first portion and/or the second portion of the exemplary apparatus in accordance with some embodiments.
Figure 13C:
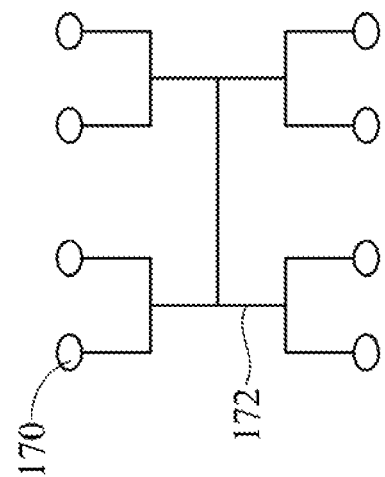
Figure 13A:
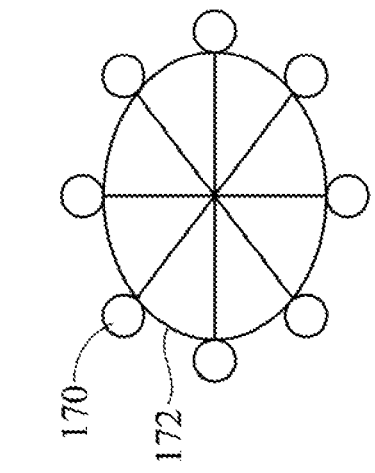

The first portion 110 and the second portion 120 can be molded through injection of the materials described herein. FIGS. 13A-13C illustrate exemplary runner system constructions used in molding the first portion 110 and/or the second portion 120 of the exemplary apparatus 100 in accordance with some embodiments. In FIGS. 13A-13C, the lines 172 represent the runners, and the circles 170 represent the injection points. These runner systems can be used to balance the pressure during injection molding and make uniform products.

At step 506, the head 126-2 of the at least one pivotal pin structure 126 is inserted into the cavity so that the first portion 110 and the second portion 120 are pivotally movable between an open configuration and a closed container configuration as described herein.

In some embodiments, the second portion 120 further comprises a third wall 128, which is between the second rear wall 122-2 and the second front wall 122-1, and is close to the second rear wall 122-2 as described above.

At step 508, a storage medium for wireless communication 130 is installed inside the second portion 120 and in a small chamber between the third wall 128 and the second rear side wall 122-2.

The method may comprise other steps of providing and installing the other structural elements as described above.

The apparatus 100 can be also reversibly dissembled. The method for dissembling the apparatus 100 comprises steps of opening the apparatus 100 by pulling the end of the latch 114 and rotating the first portion 110 and second portion 120 to 180 degrees with respect to one another, and then pulling the head 126-2 of the at least one pivotal pin structure 126 out of the cavity 117 so as to separate the first portion 110 and the second portion 120.

Figure 14:
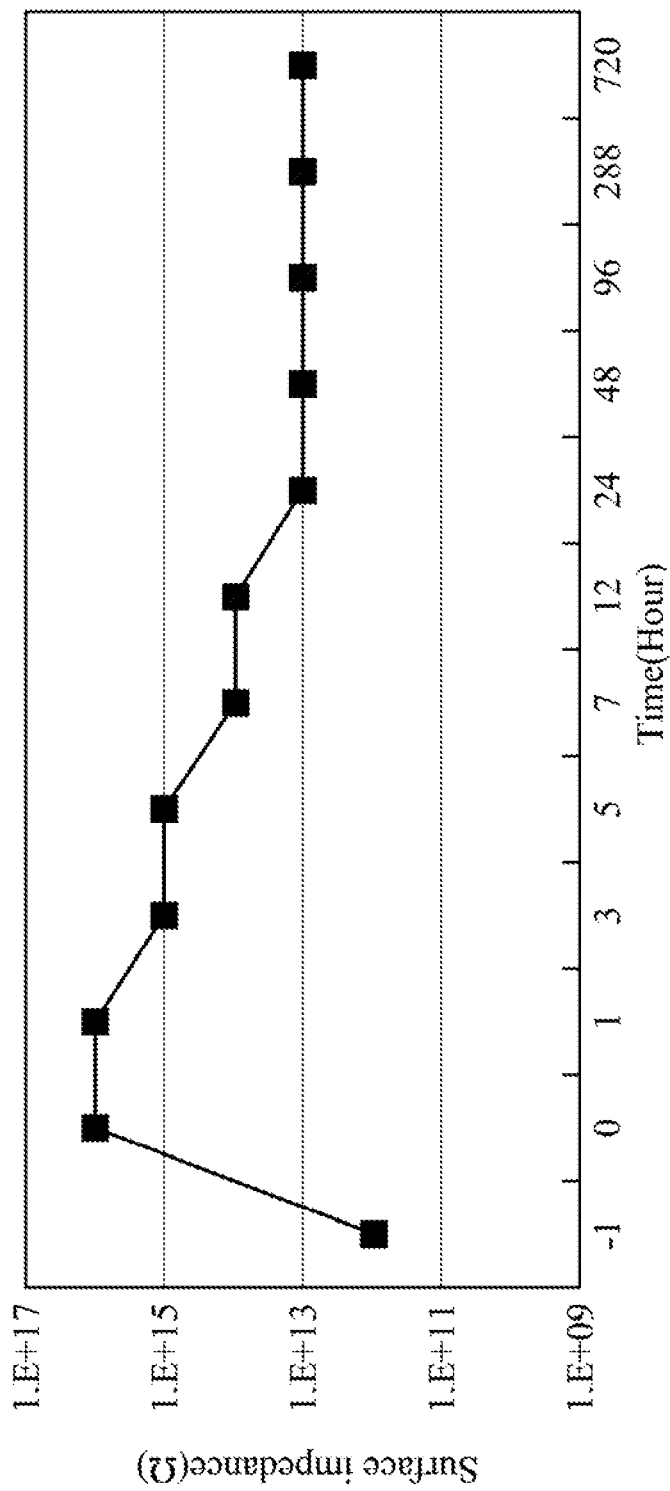
FIG. 14 shows surface impedance of a thin film made of a polymer composition for an exemplary apparatus after being washed with ultrasonic oscillation.
Figure 15:
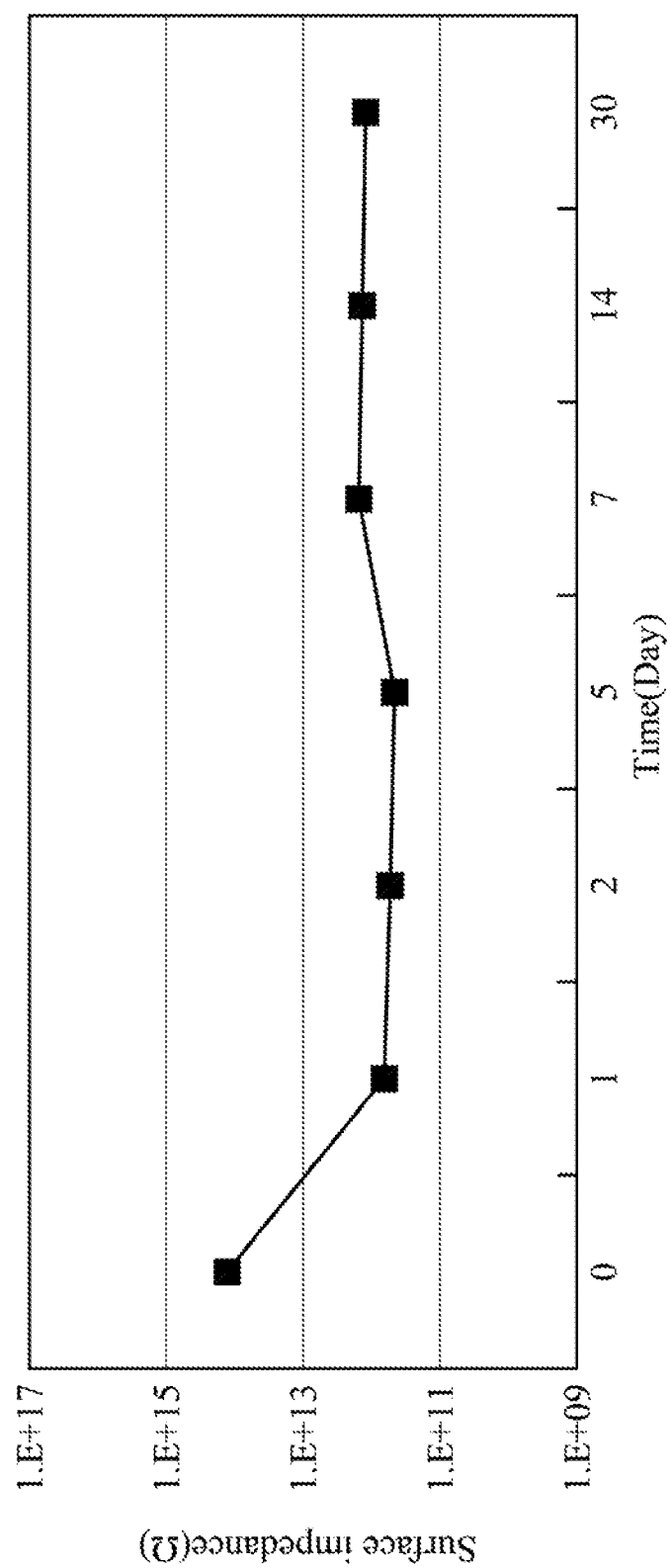
FIG. 15 shows surface impedance of a thin film made of a polymer composition for an exemplary apparatus after being used for a period of time.

The exemplary apparatus 100 has good antistatic property and durability. In some embodiments, the material for the apparatus 100 is polycarbonate based. A thin film (0.25 mm thick) of the polymer composition maintained about $10^{12}$ ohms of surface resistivity after residing in 60° C./relative humidity RH 90% for three weeks. The thin film was washed with water and ultrasound, and then dried at 70° C. for one hour. The surface resistivity was then about $10^{13}$ ohms. FIG. 14 shows surface impedance of a sample of such a thin film after being washed with ultrasonic oscillation. FIG. 15 shows surface impedance of a sample of such a thin film after being used for a period of time.

The present disclosure provides an apparatus, and a method of making the same. The apparatus is used for storing and transporting semiconductor elements.

In accordance with some embodiments, such an apparatus comprises two body portions including a first portion (or a first body portion) and a second portion (or a second body portion). The first portion comprises a first front side wall, a first rear side wall, and a top wall integrally coupled with the first front side wall and the first rear side wall. The first portion also comprises at least one pin holder integrally extending from the first rear side wall.

The second portion comprises a second front side wall, a second rear side wall, a bottom wall, and at least one pivotal pin structure. The bottom wall is integrally coupled with the second front side wall and the second rear side wall. The at least one pivotal pin structure is integrally coupled with and extending from the second rear side wall.

In some embodiments, the apparatus further comprises one or more grooved tray comprising a gel material disposed above the bottom wall configured to store semiconductor elements.

In some embodiments, the at least one pivotal pin structure comprises a shaft connected with the second rear side wall, and a head connected with the shaft. The at least one pin holder defines a cavity sized and shaped to accept the head of the at least one pivotal pin structure at an alignment. The head of the at least one pivotal pin structure is disposed inside the cavity.

The first portion and the second portion are sized and shaped to be pivotally movable between an open configuration and a closed container configuration. In some embodiments, the at least one pivotal pin structure is configured to be rotatable about the head so that the first portion is pivotally movable by 180 degree relative to the second portion from the closed container configuration to the open configuration. In the open configuration, the top wall of the first portion is coplanar with the bottom wall of the second portion, and the first and second rear side walls face with each other.

In some embodiments, the at least one pin holder comprises a groove introduction plane to facilitate installation of the head of the at least one pivotal pin structure into the cavity. The cavity in the at least one pin holder may have a non-circular cross-sectional shape matching with and having substantially the same size as a non-circular cross-sectional shape of the head of the at least one pivotal pin structure. In some embodiments, the head and the shaft in the at least one pivotal pin structure are normal to each other, and have an axe-shaped structure.

In some embodiments, the first portion further comprises a latch defining notch and integrally connected with the first front side wall. The second portion further comprises a catch structure having a projection on the second front wall, and the projection is configured to be disposed into the notch to releasably secure the latch in the closed container configuration.

In some embodiments, the at least one pivotal pin structure comprises two pivotal pin structures. The at least one pin holder in the first portion comprises two pin holders. Each respective pivotal pin structure is engaged with a respective pin holder. The two pivotal pin structures have a same dimension and are aligned at an opposite direction parallel to each other.

In some embodiments, the apparatus further comprises a storage medium for holding a wireless communication device, for example, a radio-frequency identification (RFID) device, which might be inside the apparatus in the closed container configuration. In some embodiments, the second portion further comprises a third wall between the second rear wall and the second front wall. The third wall is close to the second rear wall. The second rear wall and the third wall, together with side walls, define a compartment for housing the storage medium for wireless communication. The storage medium for wireless communication is disposed inside the second portion, and between the third and the second rear side wall.

In some embodiments, the apparatus may also further comprise at least one quick response (QR) code, which is engraved on an exterior surface of at least one of the first portion and the second portion.

In some embodiments, the first portion and the second portion comprises a polymer composition comprising polycarbonate and having a surface impedance in a range of from $10^{11}$ ohms to $10^{16}$ ohms.

In accordance with some embodiments, an apparatus for transporting semiconductor elements, comprises a first portion and a second portion. The first portion comprises a first front side wall, a first rear side wall, a top wall integrally coupled with the first front side wall and the first rear side wall, and two pin holders integrally extending from the first rear side wall. The second portion comprises a second front side wall, a second rear side wall, a bottom wall integrally coupled with the second front side wall and the second rear side wall, and two pivotal pin structures integrally coupled with and extending from the second rear side wall.

In some embodiments, each of the two pivotal pin structures comprises a shaft connected with the second rear side wall, and a respective head connected with the shaft. The two pivotal pin structures are aligned in opposite directions. Each of the two pin holders defines a respective cavity, which is sized and shaped to accept the respective head at an alignment. The respective head is disposed inside the respective cavity. The first portion and the second portion are sized and shaped to be pivotally movable between an open configuration and a closed container configuration.

In some embodiments, the apparatus further comprises a storage medium for wireless communication disposed between a third wall and the second rear side wall in the second portion.

In another aspect, the present disclosure provides a method for forming an apparatus as described herein. Such a method comprises providing a first portion and provide a second portion. The first portion comprises a first front side wall, a first rear side wall, a top wall, and at least one pin holder. The top wall is integrally coupled with the first front side wall and the first rear side wall. The at least one pin holder is integrally extending from the first rear side wall. The at least one pin holder defines a cavity.

The second portion comprises a second front side wall, a second rear side wall, a bottom wall, and at least one pivotal pin structure. The bottom wall is integrally coupled with the second front side wall and the second rear side wall. The at least one pivotal pin structure is integrally coupled with and extending from the second rear side wall. The at least one pivotal pin structure comprises a shaft connected with the second rear side wall, and a head connected with the shaft.

Such a method further comprises inserting the head of the at least one pivotal pin structure into the cavity so that the first portion and the second portion are pivotally movable between an open configuration and a closed container configuration.

In some embodiments, the second portion further comprises a third wall between the second rear wall and the second front wall as described above. The method further comprises installing a storage medium for holding a wireless communication device inside the second portion between the third wall and the second rear side wall.

The method may comprise other steps of providing and installing the other structural elements as described above. For example, the method includes providing one or more grooved tray comprising a gel material and place the one or more grooved tray above the bottom wall configured to store semiconductor elements.

The present disclosure provides an apparatus for storing and transporting semiconductor elements, with easy identification, enhanced performance, and less contamination. The present disclosure provides a novel ESD protection gel-die tray structure, and related apparatus for storing and transporting semiconductor elements.

Further, some embodiments of the present disclosure provide one or more of the following advantages: electrostatic damage identification, sample identity recognition, increase sample reserves, more robust and stable of rotation pivot, enhanced dehydrator function, enhanced antistatic properties, improvement in heat-resistance, improvement in chemical resistance, improvement in die tray lifetime, reduced shell damage, and reduction in or elimination of particle contamination.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for storing and transporting semiconductor elements, comprising:
   a first portion comprising a first front side wall, a first rear side wall, a top wall integrally coupled with the first front side wall and the first rear side wall, and at least one pin holder integrally extending from the first rear side wall;
   a second portion comprising a second front side wall, a second rear side wall, a bottom wall integrally coupled with the second front side wall and the second rear side wall, and at least one pivotal pin structure integrally coupled with and extending from the second rear side wall;
   one or more grooved tray comprising a gel material disposed above the bottom wall configured to store the semiconductor elements; and
   a storage medium for holding a wireless communication device,
   wherein
   the at least one pivotal pin structure comprises a shaft connected with the second rear side wall, and a head connected with the shaft;
   the at least one pin holder defines a cavity sized and shaped to accept the head of the at least one pivotal pin structure, wherein the head of the at least one pivotal pin structure is disposed inside the cavity;
   the first portion and the second portion are sized and shaped to be pivotally movable between an open configuration and a closed container configuration; and
   the second portion further comprises a third wall between the second rear wall and the second front wall; and the storage medium for holding a wireless communication device is removably disposed inside the second portion, and between the third and the second rear side wall.

2. The apparatus of claim 1, wherein the at least one pivotal pin structure is configured to be rotatable about the head so that the first portion is pivotally movable by 180 degree relative to the second portion from the closed container configuration to the open configuration.

3. The apparatus of claim 1, wherein in the open configuration, the top wall of the first portion is coplanar with the bottom wall of the second portion, and the first and second rear side walls face with each other.

4. The apparatus of claim 1, wherein the at least one pin holder comprises a groove introduction plane to facilitate installation of the head of the at least one pivotal pin structure into the cavity.

5. The apparatus of claim 1, wherein the cavity in the at least one pin holder has a non-circular cross-sectional shape matching with and having substantially the same size as a non-circular cross-sectional shape of the head of the at least one pivotal pin structure.

6. The apparatus of claim 1, wherein the head and the shaft in the at least one pivotal pin structure are normal to each other, and form an axe-shaped structure.

7. The apparatus of claim 1, wherein the first portion further comprises a latch defining notch and integrally connected with the first front side wall, the second portion further comprises a catch structure on the second front wall having a projection configured to be disposed into the notch to releasably secure the latch in the closed container configuration.

8. The apparatus of claim 1, wherein the at least one pivotal pin structure comprises two pivotal pin structures, the at least one pin holder in the first portion comprises two pin holders, and each respective pivotal pin structure is engaged with a respective pin holder.

9. The apparatus of claim 8, wherein the two pivotal pin structures are disposed opposite one another.

10. The apparatus of claim 1, wherein the storage medium for holding a wireless communication device includes a radio-frequency identification (RFID) device.

11. The apparatus of claim 1, further comprising at least one quick response (QR) code engraved on an exterior surface of at least one of the first portion and the second portion.

12. The apparatus of claim 1, wherein the first portion and the second portion comprises a polymer composition comprising polycarbonate and having a surface impedance in a range of from $10^{11}$ ohms to $10^{16}$ ohms.

13. A method for forming the apparatus of claim 1 for storing and transporting semiconductor elements, comprising:
   providing the first portion comprising the first front side wall, the first rear side wall, the top wall integrally coupled with the first front side wall and the first rear side wall, and the at least one pin holder integrally extending from the first rear side wall, wherein the at least one pin holder defines the cavity;
   providing the second portion comprising the second front side wall, the second rear side wall, the bottom wall integrally coupled with the second front side wall and the second rear side wall, and the at least one pivotal pin structure integrally coupled with and extending from the second rear side wall, wherein the at least one pivotal pin structure comprises the shaft connected with the second rear side wall, and the head connected with the shaft; and inserting the head of the at least one pivotal pin structure into the cavity so that the first portion and the second portion are pivotally movable between the open configuration and the closed container configuration.

14. The method of claim 13, wherein the second portion further comprises the third wall between the second rear wall and the second front wall.

15. The method of claim 14, further comprising installing the storage medium for holding the wireless communication device inside the second portion between the third wall and the second rear side wall.

16. An apparatus for storing and transporting semiconductor elements, comprising:

a first portion comprising a first front side wall, a first rear side wall, a top wall integrally coupled with the first front side wall and the first rear side wall, and two pin holders integrally extending from the first rear side wall;

a second portion comprising a second front side wall, a second rear side wall, a bottom wall integrally coupled with the second front side wall and the second rear side wall, and two pivotal pin structures integrally coupled with and extending from the second rear side wall;

one or more grooved tray comprising a gel material disposed above the bottom wall configured to store semiconductor elements; and a storage medium for holding a wireless communication device, wherein each of the two pivotal pin structures comprises a shaft connected with the second rear side wall, and a respective head connected with the shaft, the two pivotal pin structures aligned in opposite directions;

each of the two pin holders defines a respective cavity sized and shaped to accept the respective head at alignment, wherein the respective head is disposed inside the respective cavity;

the first portion and the second portion are sized and shaped to be pivotally movable between an open configuration and a closed container configuration;

the second portion further comprises a third wall between the second rear wall and the second front wall; and the storage medium for holding a wireless communication device is removably disposed inside the second portion, and between the third and the second rear side wall.

17. The apparatus of claim 16, further comprising at least one quick response (QR) code engraved on an exterior surface of at least one of the first portion and the second portion.

18. An apparatus for storing and transporting semiconductor elements, comprising:

a first portion comprising a first front side wall, a first rear side wall, a top wall integrally coupled with the first front side wall and the first rear side wall, and at least one pin holder integrally extending from the first rear side wall;

a second portion comprising a second front side wall, a second rear side wall, a bottom wall integrally coupled with the second front side wall and the second rear side wall, and at least one pivotal pin structure integrally coupled with and extending from the second rear side wall;

one or more grooved tray comprising a gel material disposed above the bottom wall configured to store the semiconductor elements; and a storage medium for holding a wireless communication device, wherein the first portion and the second portion are sized and shaped to be pivotally movable between an open configuration and a closed container configuration; and the second portion further comprises a third wall between the second rear wall and the second front wall; and the storage medium for holding a wireless communication device is removably disposed inside the second portion, and between the third and the second rear side wall.

19. The apparatus of claim 18, wherein the at least one pivotal pin structure comprises a shaft connected with the second rear side wall, and a head connected with the shaft.

20. The apparatus of claim 19, wherein the at least one pin holder defines a cavity sized and shaped to accept the head of the at least one pivotal pin structure.

* * * * *